United States Patent [19]

Heynisch

[11] Patent Number: 4,529,945
[45] Date of Patent: Jul. 16, 1985

[54] METHOD OF REMOVING DISTORTIONS IN AMPLIFIERS

[75] Inventor: Hinrich Heynisch, Gräfelfing, Fed. Rep. of Germany

[73] Assignee: Siemens Aktiengesellschaft, Berlin and Munich, Fed. Rep. of Germany

[21] Appl. No.: 497,795

[22] Filed: May 25, 1983

[30] Foreign Application Priority Data

May 28, 1982 [DE] Fed. Rep. of Germany ....... 3220252

[51] Int. Cl.³ ............................................. H03F 1/26
[52] U.S. Cl. ................................. 330/149; 330/124 R
[58] Field of Search ............... 330/124 D, 124 R, 149, 330/151, 295

[56] References Cited

U.S. PATENT DOCUMENTS 4,208,634 6/1980 Peek et al. ................. 330/124 R X
4,276,514 6/1981 Huang .................................. 330/149

FOREIGN PATENT DOCUMENTS 1085194 1/1961 Fed. Rep. of Germany ... 330/149 X

Primary Examiner—James B. Mullins
Assistant Examiner—Steven J. Mottola
Attorney, Agent, or Firm—Herbert L. Lerner; Laurence A. Greenberg

[57] ABSTRACT

Method of removing distortions in amplifiers which includes forming a difference between a part of an input voltage and of an output voltage of an amplifier so that only the distortions remain, amplifying the difference voltage by means of another amplifier to a value equal to that of the distortion part in the output of the first-mentioned amplifier and then combining the output voltage of both amplifiers so that distortions in the sum voltage are mutually compensated, including supplying a given input power to a first amplifier and twice the given input power to a phase equalization element, the first amplifier delivering output power with distortions, coupling out part of the output power via a coupling branch having directional waveguide couplers and feeding the output power part, with like amplitude though opposite phase, via a phase shifter element as well as a damping element, while opening a blocking diode, to a branch formed of the phase equalization element and an auxiliary amplifier, taking part of the output power from a coupling branch for a parallel branch having a second amplifier and feeding it to the blocking diode of the coupling branch for the first amplifier for the purpose of blocking the coupling branch for the first amplifier, feeding the remaining output power of the coupling branch for the second amplifier to an output branch via the branch formed of the phase equalization element and the auxiliary amplifier so as to compensate for the distortions.

3 Claims, 1 Drawing Figure

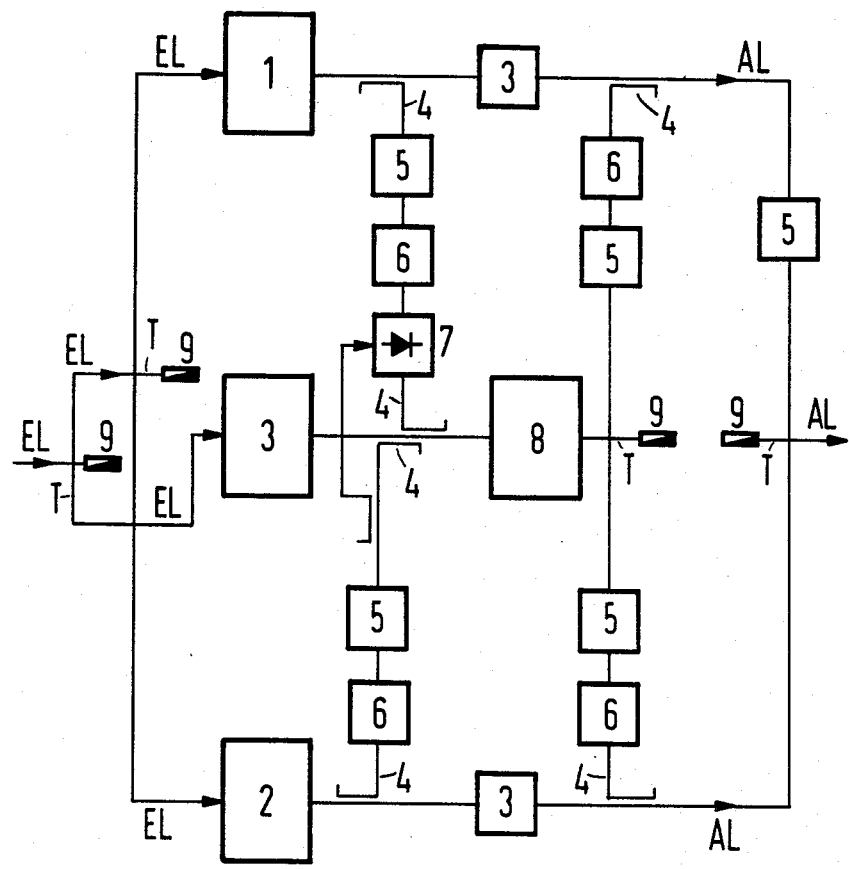

METHOD OF REMOVING DISTORTIONS IN AMPLIFIERS

BACKGROUND OF THE INVENTION

1. Field of the Invention

The invention relates to a method of removing distortions in amplifiers and, more particularly, to such a method which includes forming a difference voltage between a part of an input voltage and of an output voltage of an amplifier so that only distortions remain, amplifying the difference voltage by means of another amplifier to a value equal to that of the distortion component in the output of the first-mentioned amplifier and then combining the output voltages of both amplifiers so that distortions in the sum voltage are mutually compensated.

2. Description of Related Art

Such a method has become known heretofore from German Pat. No. 1 085 194.

In this heretofore known method, a difference voltage is initially formed which is of such nature that thereby no reaction from the output of the first-mentioned amplifier to the input thereof occurs; secondly, the output voltages of both amplifiers are brought together in such manner that, in the compensation of the distortions the output voltage of the other amplifier is decoupled or neutralized by bridge circuits or waveguide directional couplers with respect to the member producing the difference voltage and, thirdly, the effect of the phases in both amplifiers is increased by a respective phase equalization element.

SUMMARY OF THE INVENTION

It is an object of the invention to provide a method of removing distortions in amplifiers by linearizing the transmission characteristics of amplifiers, especially microwave amplifiers operating in parallel, for the purpose of providing redundancy and increased output i.e. improvement in operating efficiency.

With the foregoing and other objects in view, there is provided, in accordance with the invention, a method of removing distortions in amplifiers which includes forming a difference between a part of an input voltage and of an output voltage of an amplifier so that only the distortions remain, amplifying the difference voltage by means of another amplifier to a value equal to that of the distortion part in the output of the first-mentioned amplifier and then combining the output voltage of both amplifiers so that distortions in the sum voltage are mutually compensated, which includes supplying a given input power to a first amplifier and twice the given input power to a phase equalization element, the first amplifier delivering output power with distortions, coupling out part of the output power via a coupling branch having directional waveguide couplers and feeding the output power part, with like amplitude though opposite phase, via a phase shifter element as well as a damping element, while opening a blocking diode, to a branch formed of the phase equalization element and an auxiliary amplifier, taking part of the output power from a coupling branch for a parallel branch having a second amplifier and feeding it to the blocking diode of the coupling branch for the first amplifier for the purpose of blocking the coupling branch for the first amplifier, feeding the remaining output power of the coupling branch for the second amplifier to an output branch via the branch formed of the phase equalization element and the auxiliary amplifier so as to compensate for the distortions.

In accordance with another mode of the method invention, the coupled-out part of the output power delivered by the first amplifier via the directional waveguide couplers is approximately 20 dB.

In accordance with a concomitant mode of the method according to the invention, to balance the system, the method includes firstly switching off the first amplifier and compensating the second amplifier by means of the auxiliary amplifier via the phase shifter element and the damping element for an adjusted output power, secondly switching off the second amplifier and identically compensating the first amplifier via the phase shifter element and the damping element, and thirdly switching on both the first and the second amplifiers and doubling the output power by means of a phase shifter located in the output branch of the first amplifier.

The invention thus provides an advantage that, with a redundance circuit (parallel operation) of two amplifiers and the use of so-called forward compensation for the purpose of obtaining extreme, wide-band linearization of the two main amplifiers, only a single auxiliary amplifier is sufficient. Thus, high output power with redundance for high phase and amplitude linearity is attainable with the best possible operating efficiency. An improvement in the difference factor to the third order ($D_{32}$) of about 30 dB and more is achieved and, in fact, with a relatively wide bandwidth, which cannot be attained, for example, with regenerative signal-shaping circuits or networks.

Other features which are considered as characteristic for the invention are set forth in the appended claims.

Although the invention is illustrated and described herein as embodied in a method of removing distortions in amplifiers, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying single FIGURE of the drawing which is a block circuit diagram of a system for performing the method of removing distortions in amplifiers according to the invention.

DESCRIPTION OF THE PREFERRED EMBODIMENT

Referring now to the FIGURE of the drawing, there is shown therein diagrammatically an amplifier 1 to which input power EL is supplied. Double the input power EL is fed to a diagrammatically illustrated phase equalization element 3. Output power AL with distortions is delivered by the amplifier 1. Part of that output power AL is coupled out, for example, via 20 dB couplers 4 and, via a phase shifter element as well as a damping element, is fed with the same amplitude though opposite phase to a branch formed of phase equalization element 3 and an auxiliary amplifier 8. The nondistorted base signal component is thereby canceled by interference. Only the distortion power remains. It is amplified virtually without distortion in the auxiliary amplifier 8 (because it is a very small signal) and, in counterphase with the same amplitude as that of the distortion component in the output branch of the amplifier 1, is fed again to the latter and cancels the distortion component, in turn, through interference. The virtually undistorted signal is fed as the output power AL to the output branch.

A parallel branch with an amplifier 2 operates virtually identically. Some power is taken, however, from the coupling branch there. It serves for blocking the coupling branch of the amplifier 1, for example, by means of a blocking diode 7. Also here, the distortion is equalized and the output power AL is fed to the output branch. Both output branches provide double the output power.

If either the amplifier 1 or the amplifier 2 fails, the respective functioning amplifier continues to operate and still produces at least half the output power in the output branch.

The balance of the total system is effected as follows:

The amplifier 1 is initially switched off. The amplifier 2 is compensated by the auxiliary amplifier 8, as described hereinbefore, by means of the phase shifter 5 and the damping member 6 for an adjusted output power EL. (Measurement of $D_{32}$ as criterion).

The amplifier 2 is then switched off. The amplifier 1 is identically compensated by means of the phase shifter 5 and the damping member 6 and, in fact, with an output power AL equally adjusted for both branches.

Thirdly, both amplifiers 1 and 2 are switched on and the output power thereof is optionally added to double the output power AL through the phase shifter 5 lying in the output branch of the amplifier 1. In order that double the amplitude should not become effective in the first compensation branch, the first compensation signal coming from the amplifier 1 is always automatically blocked by the blocking diode 7 and, in fact, automatically as long as the amplifier 2 is in operation.

Hollow waveguide branches in the circuit arrangement are identified by the reference character T, and the terminating impedances thereof, by reference character 9. Such a hollow waveguide branch is also known as a magic T.

The foregoing is a description corresponding, in substance, to German application P 32 20 252.0, dated May 28, 1982, international priority of which is being claimed for the instant application, and which is hereby made part of this application. Any material discrepancies between the foregoing specification and the specification of the aforementioned corresponding German application are to be resolved in favor of the latter.

There are claimed:

1. Method of removing distortions in amplifiers which includes forming a difference between a part of an input voltage and of an output voltage of an amplifier so that only the distortions remain, amplifying the difference voltage by means of another amplifier to a value equal to that of the distortion part in the output of the firstmentioned amplifier and then combining the output voltage of both amplifiers so that distortions in the sum voltage are mutually compensated, which comprises supplying a given input power to a first amplifier and twice the given input power to a phase equalization element, the first amplifier delivering output power with distortions, coupling out part of the output power via a coupling branch having directional waveguide couplers and feeding the output power part, with like amplitude though opposite phase, via a phase shifter element as well as a damping element, while opening a blocking diode, to a branch formed of the phase equalization element and an auxiliary amplifer, taking part of the output power from a coupling branch for a parallel branch having a second amplifier and feeding it to the blocking diode of the coupling branch for the first amplifier for the purpose of blocking the coupling branch for the first amplifier, feeding the remaining output power of the coupling branch for the second amplifier to an output branch via the branch formed of the phase equalization element and the auxiliary amplifier so as to compensate for the distortions.

2. Method according to claim 1 wherein the coupled-out part of the output power delivered by the first amplifier via the directional waveguide couplers has a value of approximately 20 dB.

3. Method according to claim 1 which includes, for balancing the system, firstly switching off the first amplifier and compensating the second amplifier by means of the auxiliary amplifier via the phase shifter element and the damping element for an adjusted output power, secondly switching off the second amplifier and identically compensating the first amplifier via the phase shifter element and the damping element, and thirdly switching on both the first and the second amplifiers, and doubling the output power by means of a phase shifter located in the output branch of the first amplifier.

* * * * *